(12) United States Patent
Tanioka et al.

(10) Patent No.: US 6,426,878 B2
(45) Date of Patent: Jul. 30, 2002

(54) BARE CHIP CARRIER UTILIZING A PRESSING MEMBER

(75) Inventors: Michinobu Tanioka; Takahiro Kimura, both of Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/895,170

(22) Filed: Jul. 2, 2001

Related U.S. Application Data

(63) Continuation-in-part of application No. 09/333,887, filed on Jun. 15, 1999, now abandoned.

(30) Foreign Application Priority Data

Jun. 15, 1998 (JP) .............................................. 10-166675

(51) Int. Cl.[7] .................................................. H05K 1/18
(52) U.S. Cl. ........................ 361/760; 361/801; 361/807; 361/809; 257/678; 257/726; 257/727; 439/66; 439/91; 174/255; 174/262
(58) Field of Search ................................. 361/760, 785, 361/787, 801, 802, 807, 770, 809, 768; 257/678, 726, 727; 439/66, 91; 174/255, 262

(56) References Cited

U.S. PATENT DOCUMENTS

| | | | |
|---|---|---|---|
| 3,636,419 A | * 1/1972 | Raithel et al. | ............... 257/727 |
| 4,922,376 A | 5/1990 | Pommer et al. | |
| 5,127,837 A | * 7/1992 | Shah et al. | ..................... 439/71 |
| 5,311,402 A | * 5/1994 | Kobayashi et al. | .......... 361/760 |
| 5,321,583 A | * 6/1994 | McMahon | ................... 361/770 |
| 5,557,504 A | * 9/1996 | Siegel et al. | ................. 361/173 |
| 5,672,980 A | * 9/1997 | Charlton et al. | ............. 324/755 |
| 5,770,891 A | * 6/1998 | Frankeny et al. | ............ 257/727 |
| 5,793,618 A | * 8/1998 | Chan et al. | .................. 361/809 |
| 5,801,929 A | * 9/1998 | Cheng | ......................... 361/807 |
| 5,893,765 A | * 4/1999 | Farnworth | .................... 439/91 |
| 5,901,050 A | * 5/1999 | Imai | .............................. 361/820 |
| 6,022,225 A | * 2/2000 | Chapin et al. | ................. 439/73 |
| 6,097,609 A | * 8/2000 | Kabadi | ......................... 361/760 |

* cited by examiner

Primary Examiner—Darren Schuberg
Assistant Examiner—David Foster
(74) Attorney, Agent, or Firm—Young & Thompson

(57) ABSTRACT

The present invention provides a bare chip carrier comprising: a carrier body having a base portion on which a bare chip is mounted and also having at least one cap holder ; and a carrier cap having a pressing member for pressing the bare chip toward the base portion of the body, and the carrier cap being separated from the carrier body, wherein the at least one cap holder has at least a holder engagement portion which is to be engaged with a cap engagement portion of the carrier cap, so that the carrier cap separated from the carrier body is held by the at least one cap holder, whereby the bare chip is mounted by only a single operation of dropping the carrier cap onto the carrier body for realizing the automation.

46 Claims, 11 Drawing Sheets

Elastic property of elastomer

BARE CHIP CARRIER UTILIZING A PRESSING MEMBER

This application is a continuation-in-part of Ser. No. 09/333,887, filed Jun. 15, 1999, now abandoned.

BACKGROUND OF THE INVENTION

The present invention relates to a bare chip carrier and a method of checking the bare chip by use of the same, and more particularly to an improved bare chip carrier suitable for automation and a method of checking the bare chip by use of the same.

For the bare chip test using a test carrier, it is required to realize an automation of connection and disconnection of a bare chip to the test carrier in order to reduce a manufacturing cost for a semiconductor device. Facilitation to the automation and highly accurate positioning due to further reduction in pitch of pads of the bare chip are important. Further, in order to improve the durability of the bare chip carrier, it is also important to realize a stable contact of the bare chip to the test carrier under a low pressure application.

FIG. 1 is a cross sectional elevation view illustrative of a first conventional test carrier to which a bare chip is connected. A carrier base 7 has a recessed portion in which an elastomer 8 is placed, thereby forming a flat top surface. A contact sheet 11 is placed on the flat top surface, wherein the contact sheet 11 has a top surface on which bumps 10 are provided. A bare chip 9 to be checked is placed on the bumps 10 and over the contact sheet 11, so that pads of the bare chip 9 are made into contact with the bumps 10. A carrier cap 1 is provided over the carrier base 7 and hinged to the carrier base 7. A pressing member 3 is also provided which is connected with an inner surface of the carrier cap 1 so that if the carrier cap 1 is made closed, then the pressure member 3 comes down to press the bare chip 9 downwardly for obtaining secure contacts between the pads of the bare chip 9 and the bumps 10 on the contact sheet 11 for carrying out the required check to the bare chip.

FIG. 2 is a cross sectional elevation view illustrative of a conventional mechanism of positioning the bare chip to the test carrier of FIG. 1. The positioning of the bare chip 9 to the test carrier is made with reference to external shapes of the bare chip 9 and a plate 16, for which reason a highly accurate dicing to the bare chip 9 is thus required. This makes it difficult to realize a further reduction in pitch of the pads of the bare chip 9.

Further, the pressing member 3 of FIG. 1 has a flat pressing surface for pressing the bare chip 9. If a degree of parallelization of the bare chip 9 to the flat pressing surface of the pressing member 3 is low, then the flat pressing surface of the pressing member 3 may be graded and made into contact with an edge portion of the bare chip 9. When the carrier cap 1 is made closed, then the bare chip 9 may be displaced or may be broken.

Furthermore, the pads of the bare chip 9 may be made into contact with the bumps 10 on the contact sheet 11 by the applied pressing force only. This makes it difficult to reduce the necessary pressing force for obtaining the required secure contact of the pads of the bare chip 9 to the bumps 10. The durability is thus deteriorated and it is difficult to reduce the manufacturing cost.

FIG. 3 is a fragmentary cross sectional elevation view illustrative of a second conventional test carrier developed by Texas Instruments/Micro-Module System. The positioning of the bare chip to the test carrier is made with reference to the external shape of the bare chip. The entire surface of the bare chip is pressed by the carrier cap. If a degree of parallelization of the bare chip to the pressing surface of the cap is low, then the pressing surface of the cap may be graded and made into contact with an edge portion of the bare chip. When the carrier cap is made closed, then the bare chip may be displaced or may be broken.

It is further required to rotate the carrier cap for opening and closing the cap. This is unsuitable for realizing the required automation. The cap is made of a metal whereby it is difficult to further reduce the cost.

In the above circumstances, it had been required to develop a novel bare chip carrier and a novel method of checking the bare chip by use of the same.

SUMMARY OF THE INVENTION

Accordingly, it is an object of the present invention to provide a novel bare chip carrier free from the above problems.

It is a further object of the present invention to provide a novel bare chip carrier suitable for realizing an automation.

It is a still further object of the present invention to provide a novel bare chip carrier which is inexpensive.

It is yet a further object of the present invention to provide a novel bare chip carrier free from any possibility of displacement of a bare chip in closing a cap of the bare chip carrier.

It is a further more object of the present invention to provide a novel bare chip carrier allowing a secure and stable contact of pads of the bare chip and bumps on a contact sheet of the bare chip carrier.

It is still more object of the present invention to provide a novel bare chip carrier allowing a reduction in applied pressing force to a bare chip for checking the bare chip.

It is moreover object of the present invention to provide a novel method of checking a bare chip carrier free from the above problems.

It is another object of the present invention to provide a novel method of checking a bare chip carrier suitable for realizing an automation.

It is still another object of the present invention to provide a novel method of checking a bare chip carrier which is inexpensive.

It is yet another object of the present invention to provide a novel method of checking a bare chip carrier free from any possibility of displacement of a bare chip in closing a cap of the bare chip carrier.

It is further another object of the present invention to provide a novel method of checking a bare chip carrier allowing a secure and stable contact of pads of the bare chip and bumps on a contact sheet of the bare chip carrier.

It is an additional object of the present invention to provide a novel method of checking a bare chip carrier allowing a reduction in applied pressing force to a bare chip for checking the bare chip.

The first present invention provides a bare chip carrier comprising: a carrier body having a base portion on which a bare chip is mounted and also having at least one cap holder; and a carrier cap having a pressing member for pressing the bare chip toward the base portion of the body, and the carrier cap being separated from the carrier body, wherein the at least one cap holder has at least a holder engagement portion which is to be engaged with a cap engagement portion of the carrier cap, so that the carrier cap separated from the carrier body is held by the at least one cap holder, whereby the bare chip is mounted by only a single operation of dropping the carrier cap onto the carrier body for realizing the automation.

The second present invention provides a bare chip carrier comprising: a carrier body having a base portion on which a bare chip is mounted and also having at least one cap holder; and a carrier cap having a pressing member for pressing the bare chip toward the base portion of the body, and the carrier cap being separated from the carrier body, wherein the carrier cap further has a spring member for applying a spring force to the pressing member toward the bare chip.

The third present invention provides a bare chip carrier comprising: a carrier body having a base portion on which a bare chip is mounted and also having at least one cap holder; and a carrier cap having a pressing member for pressing the bare chip toward the base portion of the body, and the carrier cap being separated from the carrier body, wherein the pressing member has at least one protruded contact portion which is to be made into contact with part of the bare chip so as to apply the pressing force through the at least one protruded contact portion to part of the bare chip for preventing an entire surface of the bare chip is pressed by the pressing member, for which reason the bare chip is free from any displacement due to deterioration of the degree of parallelization between the bare chip and the pressing surface of the pressing member of the test carrier.

The above and other objects, features and advantages of the present invention will be apparent from the following descriptions.

BRIEF DESCRIPTION OF THE DRAWINGS

Preferred embodiments according to the present invention will be described in detail with reference to the accompanying drawings.

DISCLOSURE OF THE INVENTION

Figure 1:
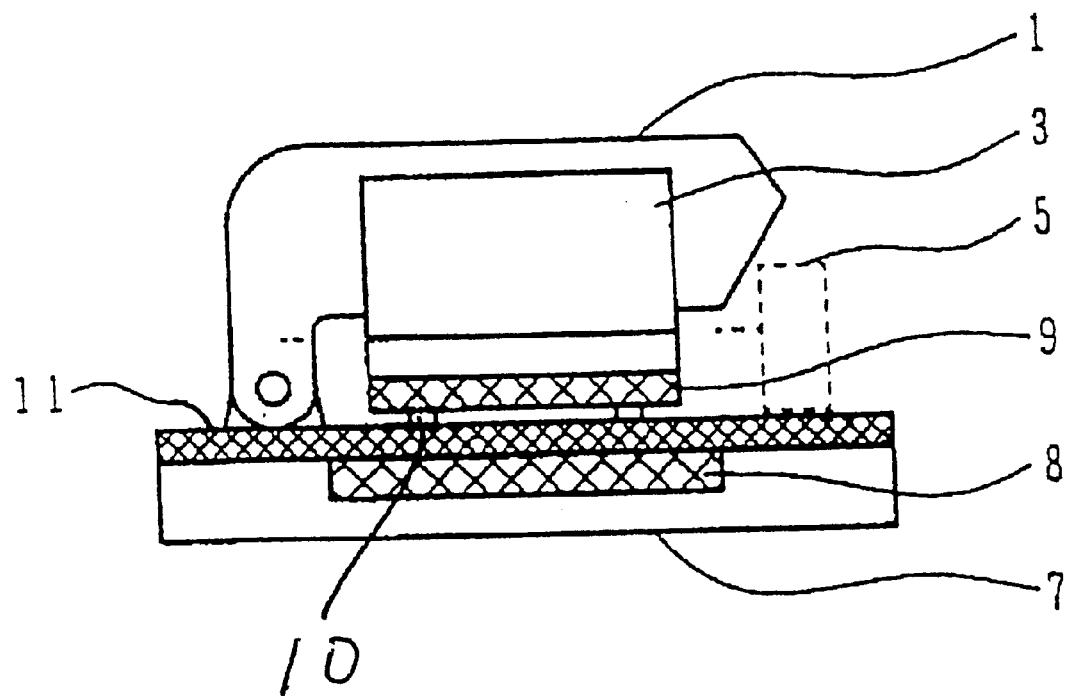
FIG. 1 is a cross sectional elevation view illustrative of a first conventional test carrier to which a bare chip is connected.
Figure 2:
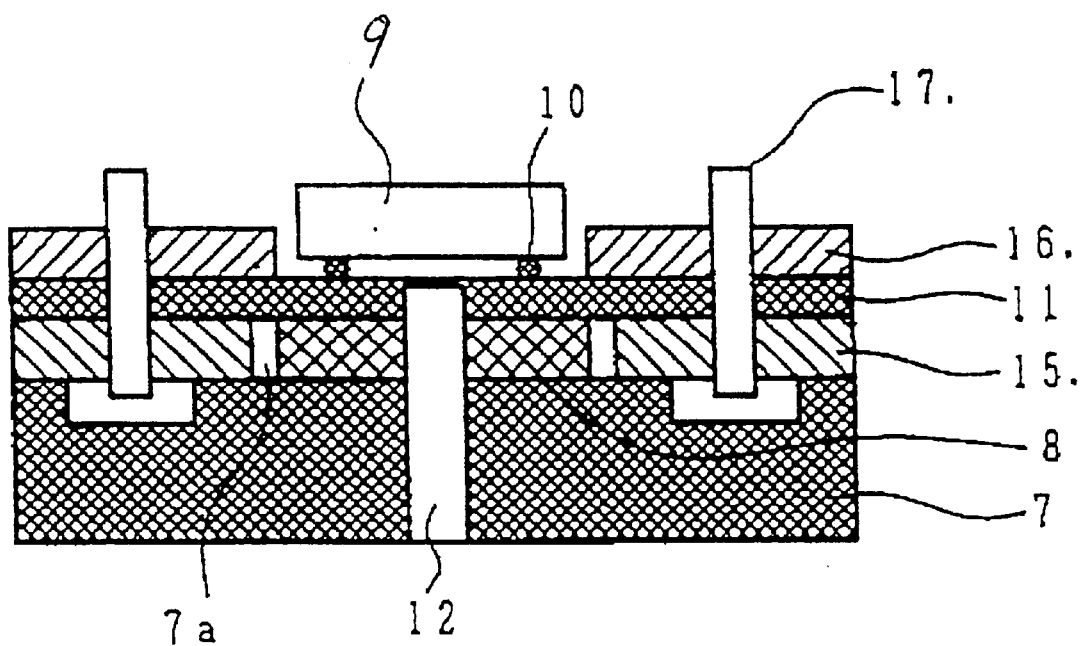
FIG. 2 is a cross sectional elevation view illustrative of a conventional mechanism of positioning the bare chip to the test carrier of FIG. 1.
Figure 3:
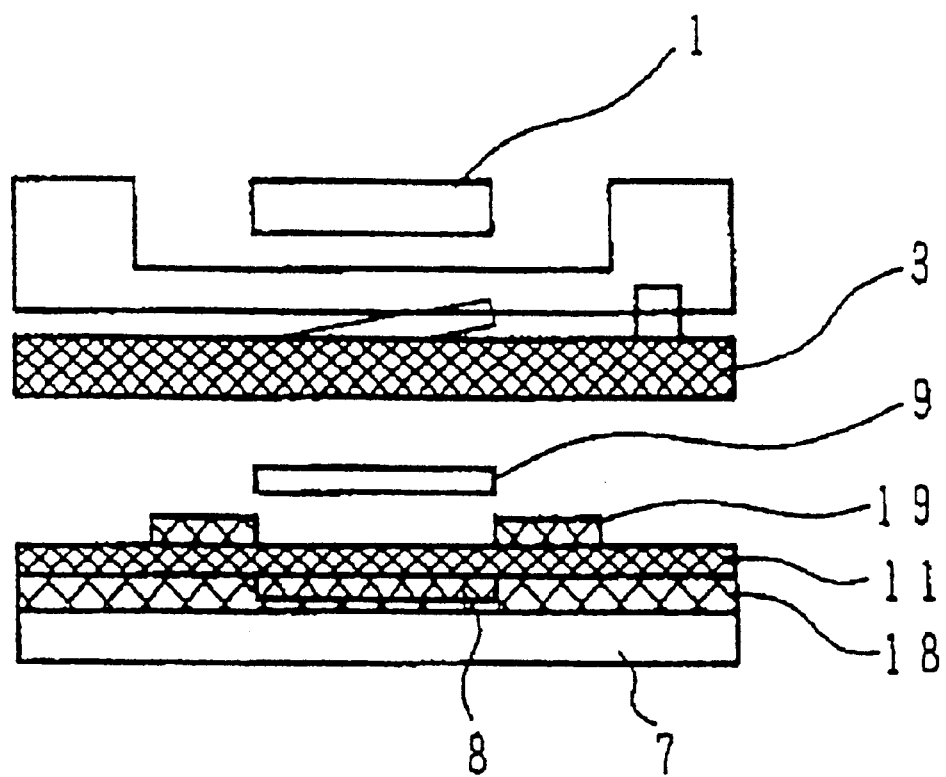
FIG. 3 is a fragmentary cross sectional elevation view illustrative of a second conventional test carrier.

The first present invention provides a bare chip carrier comprising: a carrier body having a base portion on which a bare chip is mounted and also having at least one cap holder; and a carrier cap having a pressing member for pressing the bare chip toward the base portion of the body, and the carrier cap being separated from the carrier body, wherein the at least one cap holder has at least a holder engagement portion which is to be engaged with a cap engagement portion of the carrier cap, so that the carrier cap separated from the carrier body is held by the at least one cap holder, whereby the bare chip is mounted by only a single operation of dropping the carrier cap onto the carrier body for realizing the automation.

It is preferable that the at least one cap holder comprises a plurality of cap holders hinged to the carrier body and the cap holders have a flexibility for allowing the carrier cap to be snapped into a frame of the carrier body and held with engagements between the holder engagement portion and the cap engagement portion.

It is also preferable that the carrier cap further has a spring member for applying a spring force to the pressing member toward the bare chip.

It is further preferable that a ball bearing is further provided between the spring member and the pressing member so as to allow the pressing member to perform a uniform application of the spring force to the bare chip.

It is also preferable that the pressing member has at least one protruded contact portion which is to be made into contact with part of the bare chip so as to apply the pressing force through the at least one protruded contact portion to part of the bare chip for preventing an entire surface of the bare chip is pressed by the pressing member, for which reason the bare chip is free from any displacement due to deterioration of the degree of parallelization between the bare chip and the pressing surface of the pressing member of the test carrier.

It is also preferable that the carrier body further has a contact sheet having bumps provided at corresponding positions to pads of the bare chip, and each of the bumps has a top surface which is rough.

It is also preferable that the carrier body and the carrier cap are made of the same material as each other so as to prevent any formation of broken pieces due to friction between respective engagement portions of the carrier cap and the cap hooks of the carrier body.

It is also preferable that the base portion has a recessed part receiving an elastomer which has a ratio of displacement to load at 1:1 and exhibits no substantive permanent strain or distortion. The elastomer relaxes the difference in level of the bumps when the bare chip is mounted onto the carrier body, so as to keep a distance between the bare chip and the contact sheet for preventing any contact of circuits on the contact sheet and the bare chip. The elastomer relaxes variation in level of the bumps on the contact sheet when the bare chip is mounted onto the carrier body, so as to allow a stable contact between the bare chip and the contact sheet. The elastomer is made of a material which has a high elasticity and prevents a deformation of the contact sheet under high temperature condition, whereby the durability is improved.

The second present invention provides a bare chip carrier comprising: a carrier body having a base portion on which a bare chip is mounted and also having at least one cap holder; and a carrier cap having a pressing member for pressing the bare chip toward the base portion of the body, and the carrier cap being separated from the carrier body, wherein the carrier cap further has a spring member for applying a spring force to the pressing member toward the bare chip.

It is preferable that a ball bearing is further provided between the spring member and the pressing member so as to allow the pressing member to perform a uniform application of the spring force to the bare chip.

It is also preferable that the at least one cap holder has at least a holder engagement portion which is to be engaged with a cap engagement portion of the carrier cap, so that the carrier cap separated from the carrier body is held by the at least one cap holder, whereby the bare chip is mounted by only a single operation of dropping the carrier cap onto the carrier body for realizing the automation.

It is further preferable that the at least one cap holder comprises a plurality of cap holders hinged to the carrier body and the cap holders have a flexibility for allowing the carrier cap to be snapped into a frame of the carrier body and held with engagements between the holder engagement portion and the cap engagement portion.

It is also preferable that the pressing member has at least one protruded contact portion which is to be made into contact with part of the bare chip so as to apply the pressing force through the at least one protruded contact portion to part of the bare chip for preventing an entire surface of the bare chip is pressed by the pressing member, for which reason the bare chip is free from any displacement due to deterioration of the degree of parallelization between the bare chip and the pressing surface of the pressing member of the test carrier.

It is also preferable that the carrier body further has a contact sheet having bumps provided at corresponding positions to pads of the bare chip, and each of the bumps has a top surface which is rough.

It is also preferable that the carrier body and the carrier cap are made of the same material as each other so as to prevent any formation of broken pieces due to friction between respective engagement portions of the carrier cap and the cap hooks of the carrier body.

It is also preferable that the base portion has a recessed part receiving an elastomer which has a ratio of displacement to load at 1:1 and exhibits no substantive permanent strain or distortion. The elastomer relaxes the difference in level of the bumps when the bare chip is mounted onto the carrier body, so as to keep a distance between the bare chip and the contact sheet for preventing any contact of circuits on the contact sheet and the bare chip. The elastomer relaxes variation in level of the bumps on the contact sheet when the bare chip is mounted onto the carrier body, so as to allow a stable contact between the bare chip and the contact sheet. The elastomer is made of a material which has a high elasticity and prevents a deformation of the contact sheet under high temperature condition, whereby the durability is improved.

The third present invention provides a bare chip carrier comprising: a carrier body having a base portion on which a bare chip is mounted and also having at least one cap holder; and a carrier cap having a pressing member for pressing the bare chip toward the base portion of the body, and the carrier cap being separated from the carrier body, wherein the pressing member has at least one protruded contact portion which is to be made into contact with part of the bare chip so as to apply the pressing force through the at least one protruded contact portion to part of the bare chip for preventing an entire surface of the bare chip is pressed by the pressing member, for which reason the bare chip is free from any displacement due to deterioration of the degree of parallelization between the bare chip and the pressing surface of the pressing member of the test carrier.

It is preferable that the at least one cap holder has at least a holder engagement portion which is to be engaged with a cap engagement portion of the carrier cap, so that the carrier cap separated from the carrier body is held by the at least one cap holder, whereby the bare chip is mounted by only a single operation of dropping the carrier cap onto the carrier body for realizing the automation.

It is also preferable that the at least one cap holder comprises a plurality of cap holders hinged to the carrier body and the cap holders have a flexibility for allowing the carrier cap to be snapped into a frame of the carrier body and held with engagements between the holder engagement portion and the cap engagement portion.

It is also preferable that the carrier cap further has a spring member for applying a spring force to the pressing member toward the bare chip.

It is further preferable that a ball bearing is further provided between the spring member and the pressing member so as to allow the pressing member to perform a uniform application of the spring force to the bare chip.

It is also preferable that the carrier body further has a contact sheet having bumps provided at corresponding positions to pads of the bare chip, and each of the bumps has a top surface which is rough.

It is also preferable that the carrier body and the carrier cap are made of the same material as each other so as to prevent any formation of broken pieces due to friction between respective engagement portions of the carrier cap and the cap hooks of the carrier body.

It is also preferable that the base portion has a recessed part receiving an elastomer which has a ratio of displacement to load at 1:1 and exhibits no substantive permanent strain or distortion. The elastomer relaxes the difference in level of the bumps when the bare chip is mounted onto the carrier body, so as to keep a distance between the bare chip and the contact sheet for preventing any contact of circuits on the contact sheet and the bare chip. The elastomer relaxes variation in level of the bumps on the contact sheet when the bare chip is mounted onto the carrier body, so as to allow a stable contact between the bare chip and the contact sheet. The elastomer is made of a material which has a high elasticity and prevents a deformation of the contact sheet under high temperature condition, whereby the durability is improved.

The fourth present invention provides a bare chip carrier comprising: a carrier body having a base portion and also having at least one cap holder which has at least a holder engagement portion; a carrier cap separate from the carrier body, the carrier cap having a carrier cap engagement portion adapted to be engaged with the holder engagement portion for holding the carrier cap to the carrier body, and the carrier cap having a pressing member for pressing the bare chip toward the base portion of the body; and a first elastomer provided between the carrier cap and the pressing member for providing an elastic force to the pressing member upon holding the carrier cap to the carrier body.

It is preferable that the base portion has a recessed part receiving a second elastomer.

It is also preferable that the first and second elastomers are made of the same material.

It is preferable that the first elastomer comprises a rectangle-shaped silicone resin material.

It is preferable that the first elastomer comprises a rectangle-shaped silicone resin material having air-containing cells.

It is preferable to further comprise at least two of the cap holders, each of the cap holders being hinged to the carrier body and each of the cap having a flexibility for allowing the carrier cap to be snapped into a frame of the carrier body and held with engagements between the holder engagement portion and the cap engagement portion.

It is preferable that the pressing member has at least one protruded contact portion which is to be made into contact with part of the bare chip so as to apply the pressing force through the at least one protruded contact portion to part of the bare chip for preventing an entire surface of the bare chip is pressed by the pressing member.

It is preferable that the carrier body further has a contact sheet having bumps provided at corresponding positions to pads of the bare chip.

Figure 4:
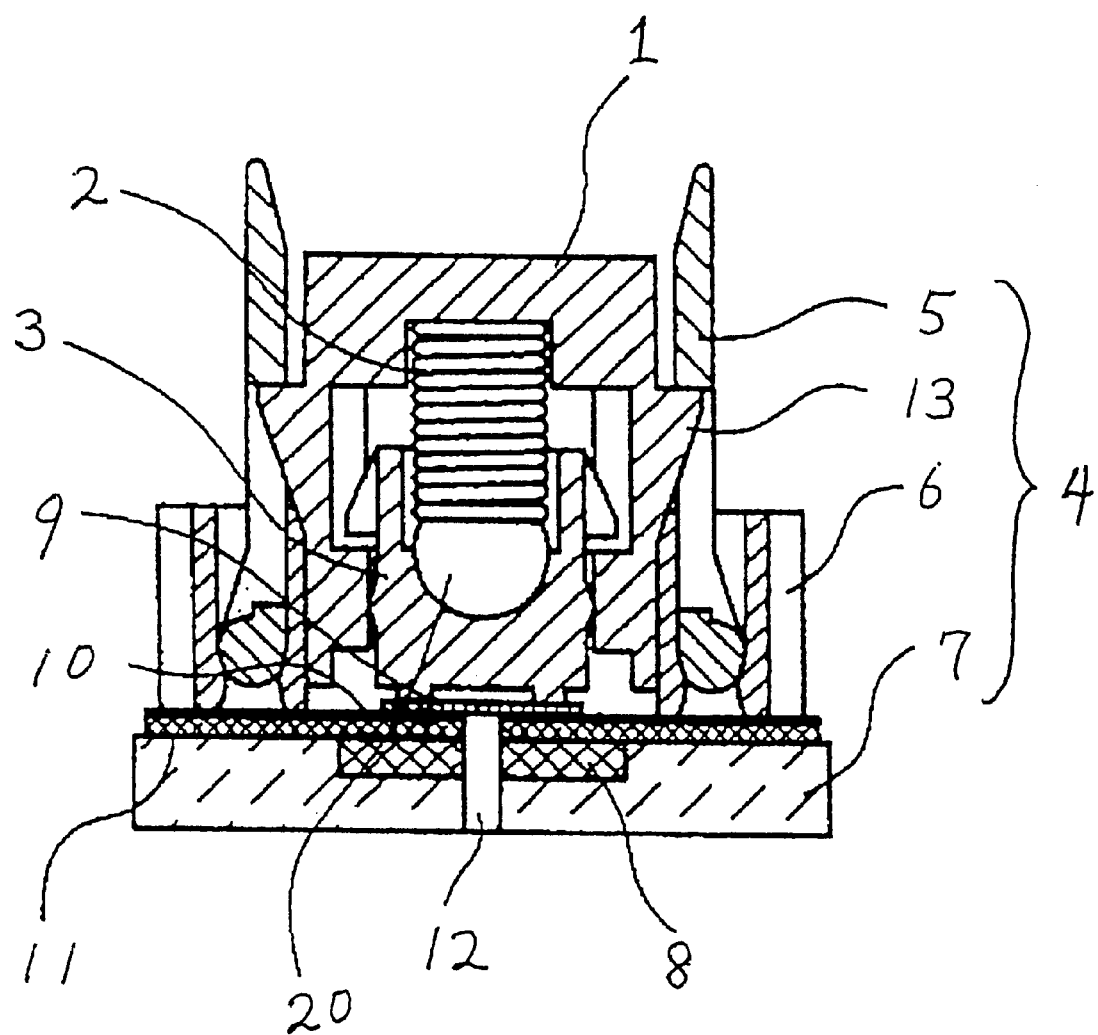
FIG. 4 is a cross sectional elevation view illustrative of a first novel bare chip carrier in a first embodiment in accordance with the present invention.

A first embodiment according to the present invention will be described in detail with reference to the drawings. FIG. 4 is a cross sectional elevation view illustrative of a first novel bare chip carrier in a first embodiment in accordance with the present invention. The bare chip carrier has a carrier base 7 and a carrier body 4 on the carrier base 7. The carrier base 7 has a recessed portion in which an elastomer 8 is placed. A contact sheet 11 is provided over the carrier base 7 with the elastomer 8. Bumps 10 are provided on the contact sheet 11. A bare chip 9 to be checked is placed on the bumps 10 and over the contact sheet 11, so that pads of the bare chip 9 are made into contact with the bumps 10. A carrier frame 6 is provided on the carrier base 7. A carrier cap 1 is provided over the carrier frame 6 and hinged to the carrier frame 6. The carrier cap 1 has hook stages 13 which comprise flat upper surfaces. Carrier cap hooks 5 are provided and connected to the carrier frame 6, so that the carrier cap hooks 5 are made into engagement with the hook stages of the carrier cap 1 whereby the carrier cap 1 is held by the carrier cap hooks 5. The carrier cap 1 has an inner surface connected with one side of a spring 2. A ball 20 is provided with an opposite side of the spring 2 so that the ball 20 is pressed downwardly by a spring force of the spring 2 when the carrier cap 1 is made closed. A pressing member 3 is also provided which is in contact with the ball 20 so that the pressing member 3 is pressed downwardly by the spring force of the spring 2, wherein the spring force is transmitted through the ball 20 to the pressing member 3 when the carrier cap 1 is made closed. The pressing member 3 has a pressing face which is made into contact with the bare chip 9. When the carrier cap 1 is made closed, then the pressing member 3 presses the bare chip 9 with a pressing force adjusted by the spring force of the spring 2. The carrier cap hooks 5 have flexibility. The carrier base 7 has an absorption through hole 12 which is positioned at a center of the carrier base 7 and penetrates not only the carrier base 7 but also the elastomer 8. The absorption through hole 12 is provided in order to provisionally hold the position of the bare chip 9 before the bare chip 9 is pressed with the pressing member 3 and thus held for checking the bare chip 9.

Figure 5:
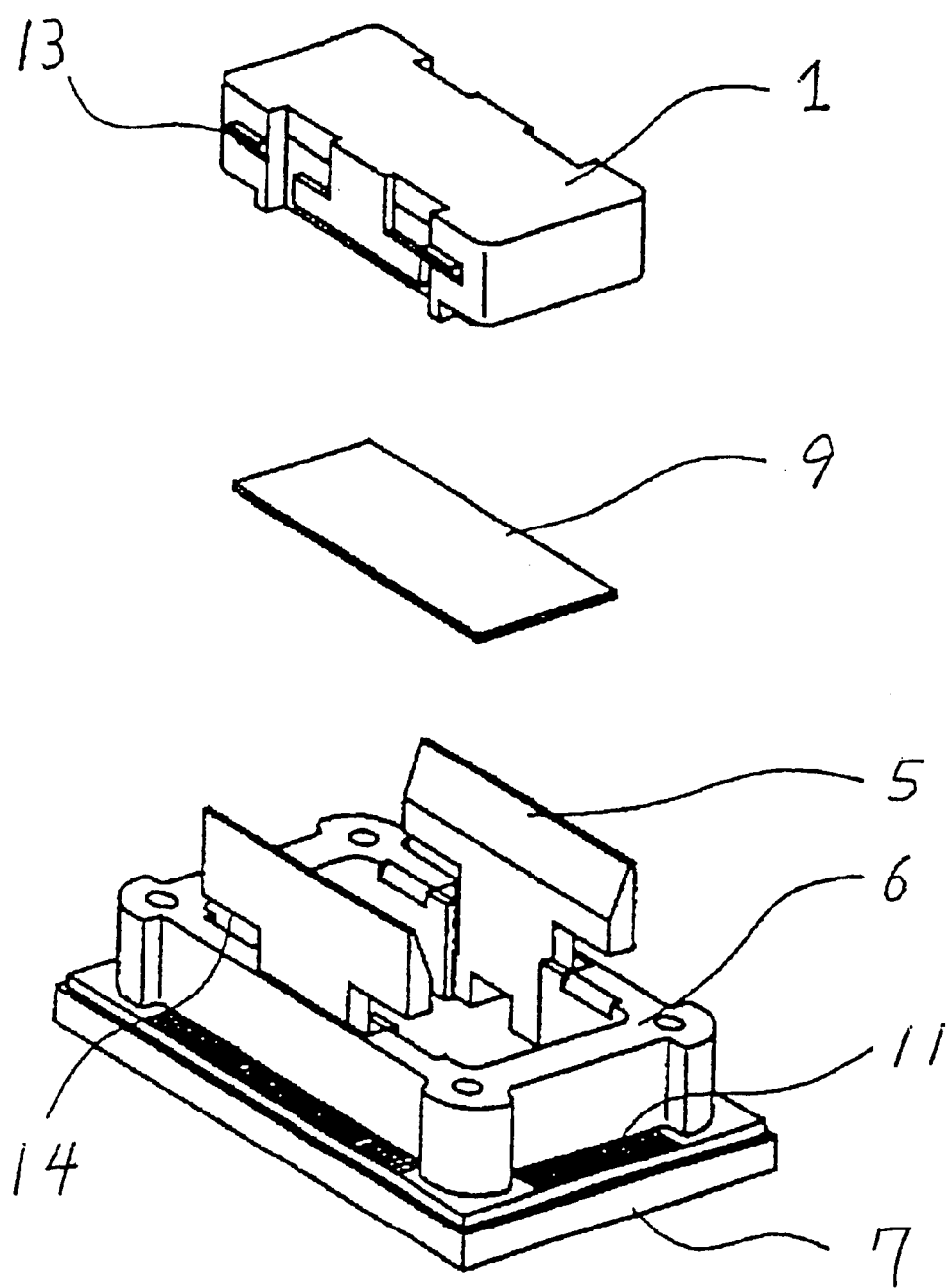
FIG. 5 is a perspective view illustrative of a first novel bare chip carrier of FIG. 4 before a bare chip is placed.
Figure 6:
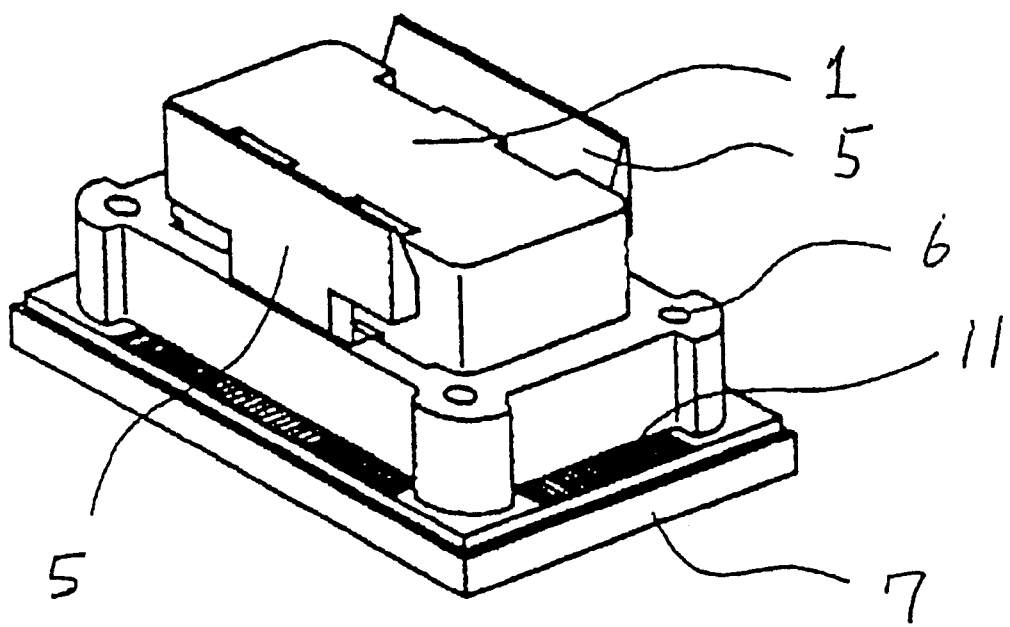
FIG. 6 is a perspective view illustrative of a first novel bare chip carrier of FIG. 4 after a bare chip was placed.
Figure 7:
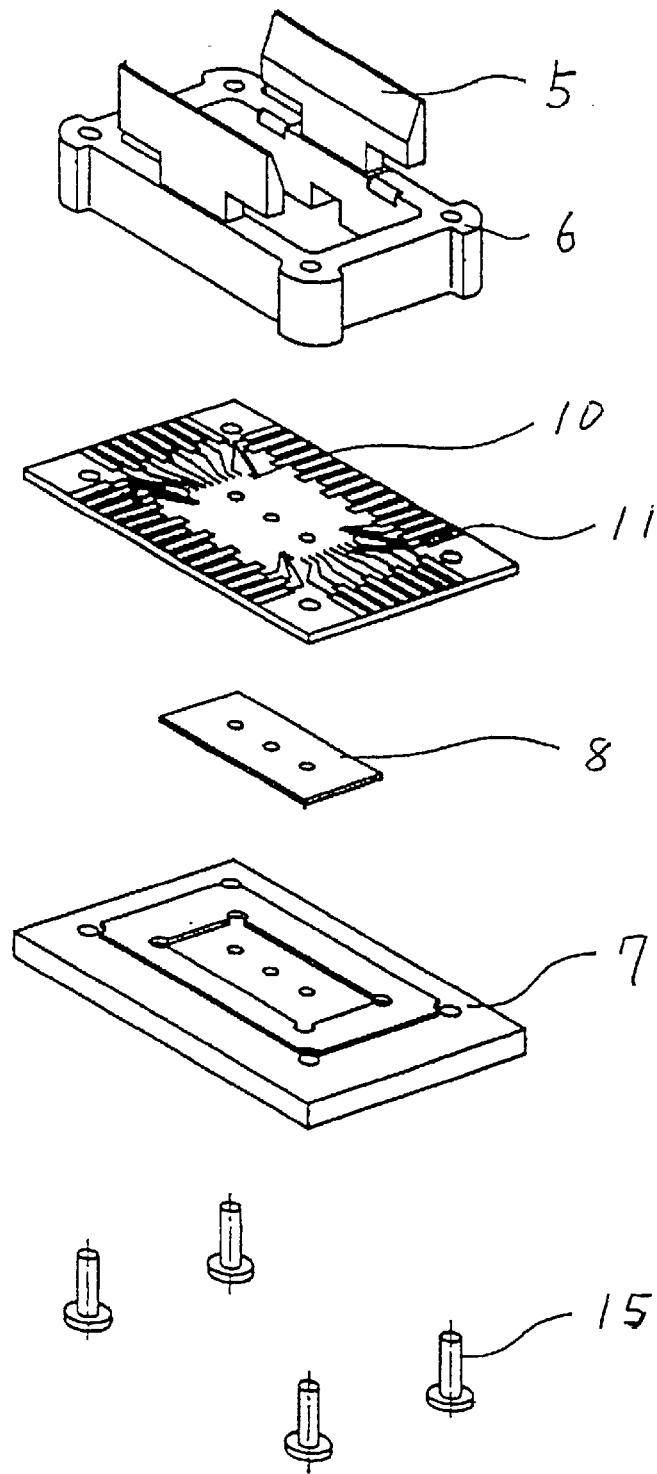
FIG. 7 is a perspective view illustrative of individual parts of the bare chip carrier of FIG. 4.

FIG. 5 is a perspective view illustrative of a first novel bare chip carrier of FIG. 4 before a bare chip is placed. FIG. 6 is a perspective view illustrative of a first novel bare chip carrier of FIG. 4 after a bare chip was placed. FIG. 7 is a perspective view illustrative of individual parts of the bare chip carrier of FIG. 4.

With reference to FIG. 7, the elastomer 8 is placed within the recessed portion of the carrier base 7. The contact sheet 11 with the bumps 10 is placed thereon. The carrier frame 6 is provided on the contact sheet 11, wherein a pair of the carrier cap hooks 5 are hinged to the carrier frame 6. The carrier base 7, the contact sheet 11 and the carrier frame 6 are assembled with each other by screws 15.

With reference to FIG. 5, the carrier cap hooks 5 are made open, and the bare chip is placed before the carrier cap 1 is snapped into the carrier frame 6 and the carrier cap hooks 5 are made into engagement with the hook stages 13 of the carrier cap 1. Namely, only drop of the carrier cap 1 onto the carrier frame 6 results in engagement of the carrier cap 1 to the carrier frame 6. This structure is suitable for the required automation. The carrier cap 1 is made of the same material as the carrier body 4, so as to prevent formation of any broken piece due to contact between the hook stages 13 of the carrier cap 1 and contact portions 14 of the carrier cap hooks 5 when the carrier cap 1 is engaged into the carrier frame 6.

Figure 8A:
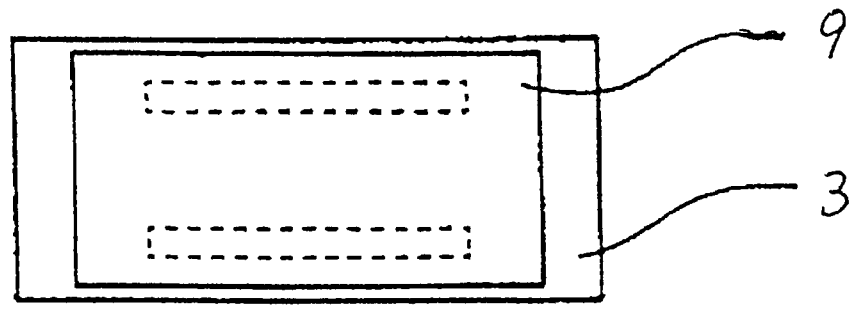
FIG. 8A is a plane view illustrative of the bare chip and the pressing member of FIG. 4.
Figure 8B:
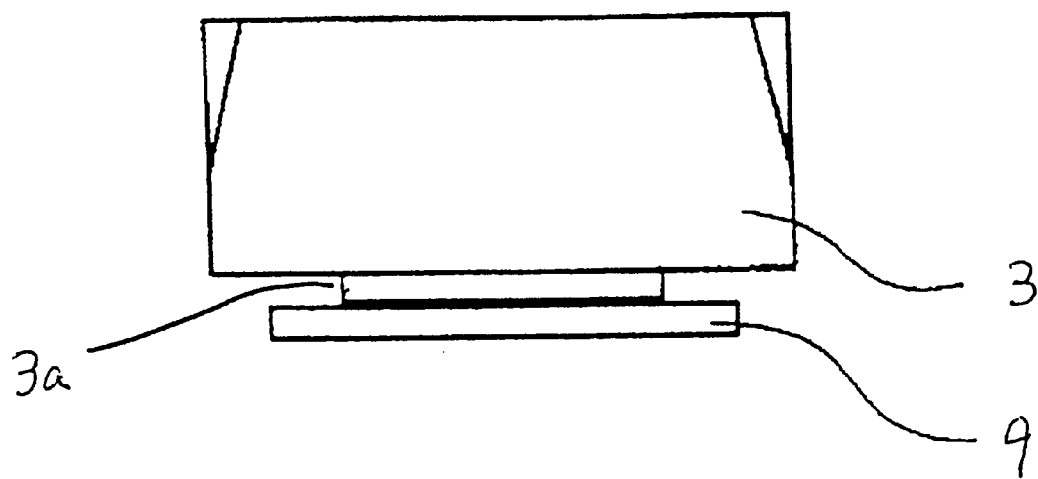
FIG. 8B is a side view illustrative of the bare chip and the pressing member of FIG. 4.

FIG. 8A is a plane view illustrative of the bare chip and the pressing member of FIG. 4. FIG. 8B is a side view illustrative of the bare chip and the pressing member of FIG. 4. The pressing member 3 of the bare chip carrier has a pressing surface which has protruded flat-faced contact portions 3a which are made into contact directly with the bare chip 9 so that the bare chip 9 is pressed downwardly toward the elastomer 8. The protruded flat-faced contact portions 3a are stripe-shaped and extend in parallel to each other in the plane view of FIG. 8A. The provision of those protruded flat-faced contact portions 3a prevents an entire surface of the pressing member 3 from contact with the bare chip, thereby preventing that the pressing force is locally applied or concentrated to a local part or limited part of the bare chip 9. This may prevent deterioration of the contact between all of the pads of the bare chip 9 to the corresponding bumps 10. This further may prevent any displacement of the bare chip 9.

The ball 20 or ball bearing allows the pressing member 3 to perform the uniform application of the pressing force to the bare chip.

The elastomer 8 relaxes variation in level of the bumps 10 on the contact sheet 11 when the bare chip 9 is mounted onto the carrier body 4, so as to allow a stable contact between the bare chip 9 and the contact sheet 11. The elastomer 8 may preferably be made of a material which has a high elasticity and prevents a deformation of the contact sheet 11 under high temperature condition.

Figure 9:
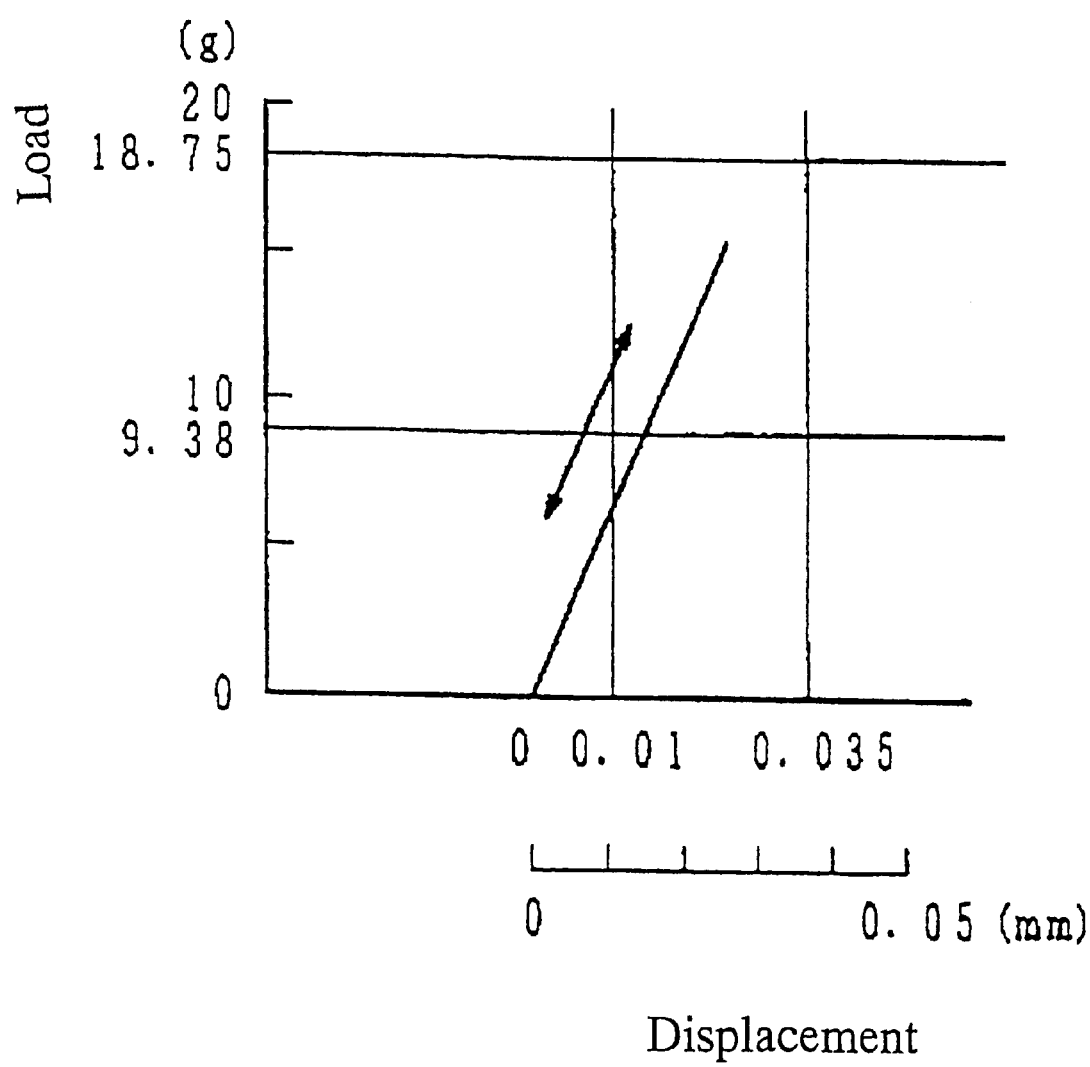
FIG. 9 is a diagram illustrative of variation in load over displacement to explain elastic properties of the elastomer of the bare chip carrier of FIG. 4.
Figure 10:
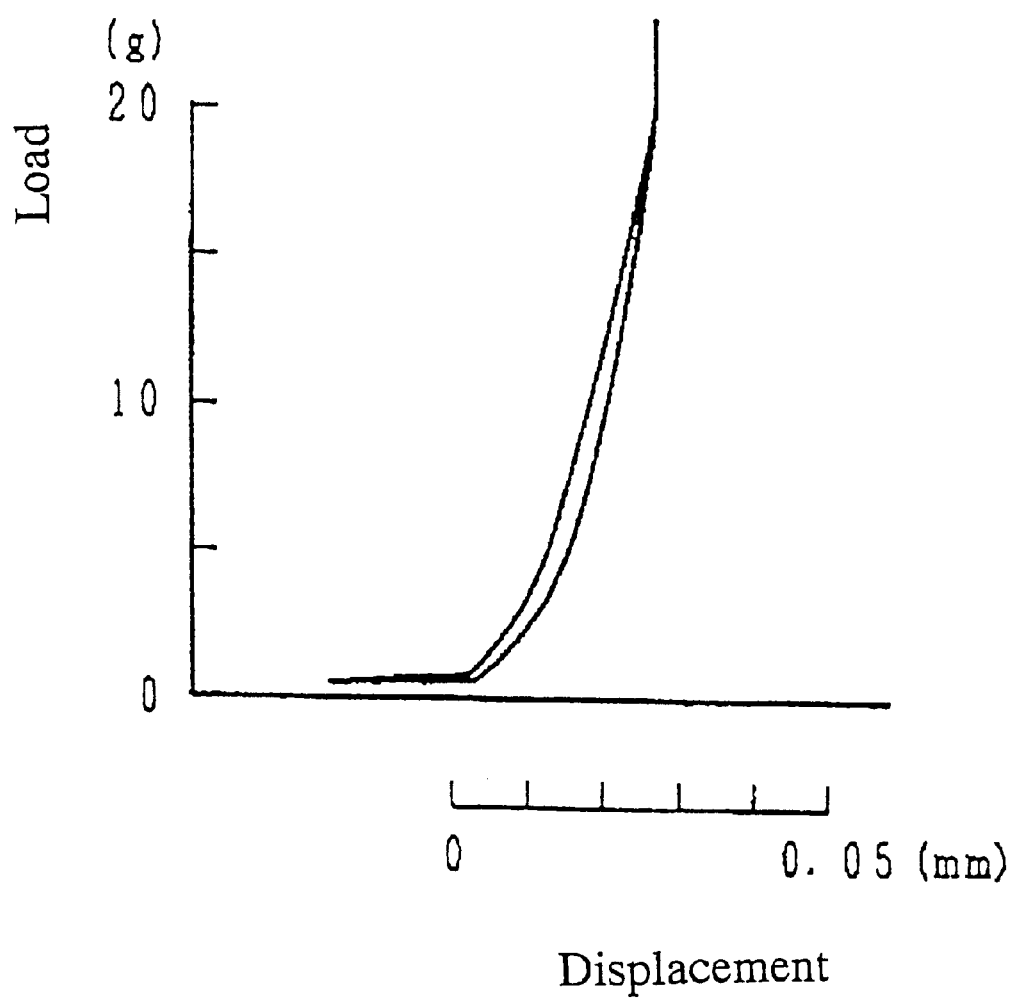
FIG. 10 is a diagram illustrative of variation in load over displacement of the elastomer of the first novel bare chip carrier to explain elastic properties of the elastomer of the bare chip carrier of FIG. 4.

FIG. 9 is a diagram illustrative of variation in load over displacement to explain elastic properties of the elastomer of the bare chip carrier of FIG. 4. The preferable material for the elastomer 8 is such that if the displacement is increased and then decreased, a ratio of displacement to load is 1:1 and a displacement is in the range of 0.01–0.35 millimeters under loads of 9.4–18.8 g, and further the material for the elastomer 8 is free from permanent strain or distortion. FIG. 10 is a diagram illustrative of variation in load over displacement of the elastomer of the first novel bare chip carrier to explain elastic properties of the elastomer of the bare chip carrier of FIG. 4.

The bumps 10 have contact surfaces which have large surface roughness in the range of 0.2–1.0±0–0.5 micrometers for stable contact between the pads of the bare chip 9 and the bumps 10 over the contact sheet 11. After the bare chip 9 has been placed onto the bare chip test carrier, a pre-heat treatment is carried out to cause a thermal expansion of the contact sheet 11 whereby a scrub effect is caused the aluminum pads of the bare chip 9 and the bumps 10 of the contact sheet 11.

The semiconductor wafer is checked and then diced into bare chips. The bare chip is mounted onto the test carrier, wherein a circuit face on which circuits are formed of the bare chip is faced down and then the positioning of the bare chip to the test carrier is made by use of the camera so that the aluminum pads of the bare chip and the interconnection patterns are aligned to the bumps and the interconnection patterns of the contact sheet of the carrier body, whereby the aluminum pads of the bare chip are made into contact with the bumps 10. After the pressure reaches a predetermined value, for example, 100 g, then an adsorption to the bare chip is carried out through the absorption through hole 12. The carrier cap 1 is dropped down to the carrier body 4 so that the carrier cap 1 is held by the carrier cap hooks 5 whilst the adsorption to the bare chip is discontinued. The pressing force of the pressing member 3 to the bare chip 9 depends upon the spring contact of the spring 2.

The test carrier is then placed in a high temperature bath for carrying out a pre-heat treatment at a temperature of 125° C. for three minutes, whereby a difference in thermal expansion coefficient among the bare chip 9, the contact sheet 11 and the carrier base 7 causes a scrub at contact points between the tops of the bumps 10 of the contact sheet 11 and the aluminum pads of the bare chip 9. This scrub effect breaks oxide films on the surfaces of the aluminum pads 10 whereby the stable contact between the aluminum pads of the bare chip and the bumps of the contact sheet 11 can be obtained. After the pre-heat treatment, the bum-in and subsequent selection and inspection are made to find out the defective products. The bare chip is then disconnected from the test carrier in the reversed steps to the above mentioned connecting steps.

Figure 11:
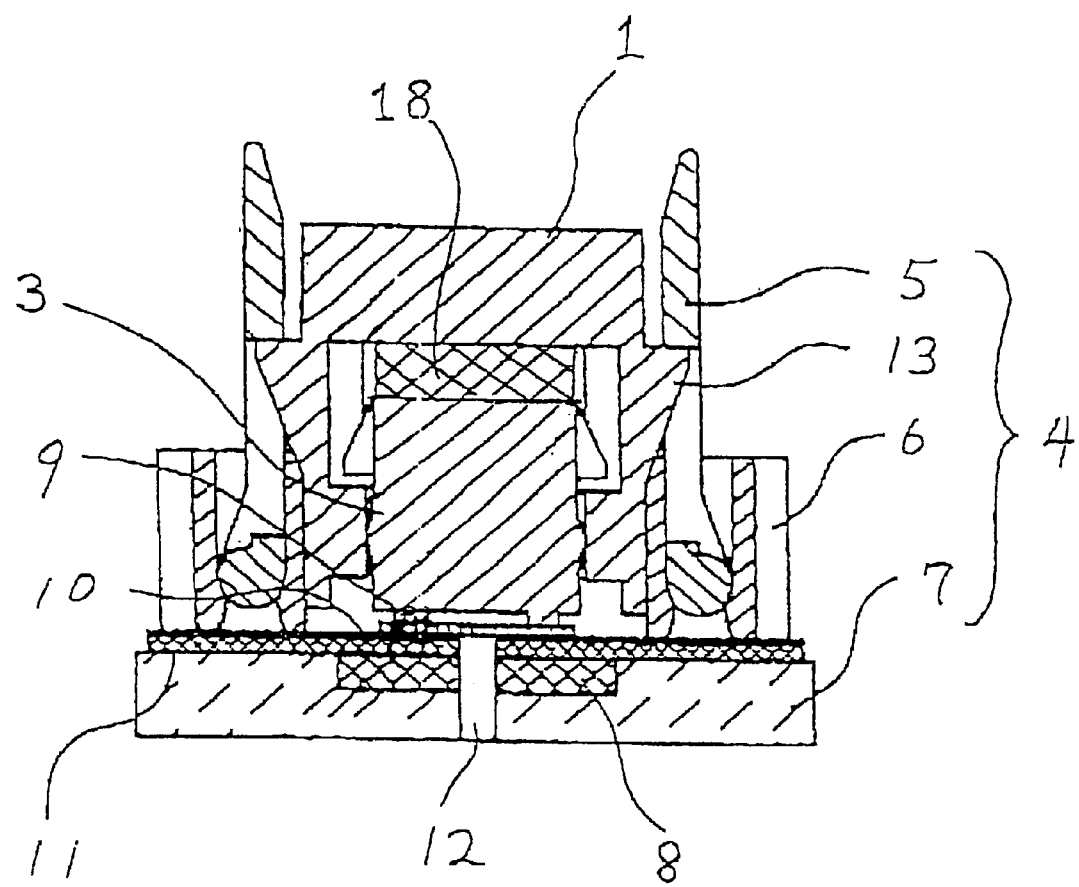
FIG. 11 is a cross sectional elevation view illustrative of a structurally modified novel bare chip carrier in accordance with the present invention.

A structural modification to the above-described novel bare chip carrier shown in FIG. 4 may optionally be available. FIG. 11 is a cross sectional elevation view illustrative of a structurally modified novel bare chip carrier in accordance with the present invention. A structural difference of the modified novel bare chip carrier of FIG. 11 from the above-described novel bare chip carrier shown in FIG. 4 is that, in place of the combination of the spring 2 and the ball bearing 20, an elastomer 18 is provided between a roof wall of the carrier cap 1 and a top surface of the pressing member 3.

In the above-described novel bare chip carrier shown in FIG. 4, the spring force is applied through the ball bearing 20 to the pressing member 3. In contrast, in accordance with the modified novel bare chip carrier of FIG. 11, an elastic force of the elastomer 18 is applied to the pressing member 3. The modified novel bare chip carrier is more simple in structure than the above-described novel bare chip carrier. This structural simplification may allow a further cost reduction.

As illustrated in FIG. 11, the elastomer 18 may optionally comprise a single member which has a generally rectangle-shape and is made of any available elastic materials such as a silicone resin or rubber, and a silicone resin including air-containing cells.

Optionally, a top surface of the elastomer 18 may be fixed or adhered to the roof wall of the carrier cap 1 and a bottom surface of the elastomer 18 in contact tightly or loosely with the top surface of the pressing member 3. Alternatively the bottom surface of the elastomer 18 may be fixed or adhered to the top surface of the pressing member 3 and the top surface of the elastomer 18 in contact tightly or loosely with the roof wall of the carrier cap 1.

Alternatively, even illustration is omitted, the elastomer 18 may optionally comprise plural members, each of which has a generally rectangle-shape and is made of any available elastic materials such as a silicone resin or rubber, and a silicone resin including air-containing cells.

The modified novel bare chip carrier is more simple in structure than the above-described novel bare chip carrier. This structural simplification may allow a further cost reduction.

The above present invention provides the following eight effects.

First, connection of the bare chip to the test carrier is made by optical positioning between the aluminum pads and the interconnection patterns of the bare chip to the bumps and the interconnection pattern of the contact sheet, for which reason it is possible to carry out a dicing process after the wafer inspection without any specific or high accurate dicing.

Second, the connection of the bare chip to the test carrier is made by optical positioning between the aluminum pads and the interconnection patterns of the bare chip to the bumps and the interconnection pattern of the contact sheet, for which reason no positioning pins nor positioning guides for positioning bare chip are necessary. This means it possible to reduce the number of the necessary parts for connecting the bare chip to the test carrier. It is also possible that the test carrier is made of a resin for reducing the cost.

Third, after the bare chip has been incorporated into the test carrier, then a pre-heat treatment is carried out to cause a scrub effect at contact points between the aluminum pads of the bare chip and the tops of the bumps of the contact sheet so that the stable contact between the pads of the bare chip and the bumps can be obtained, thereby improvement in durability of the test carrier.

Fourth, the pressing member for pressing the bare chip has one or more protruded contact portions which are made into contact with the bare chip, for which reason the bare chip is free from any displacement due to deterioration of the degree of parallelization between the bare chip and the pressing surface of the pressing member of the test carrier.

Fifth, the bare chip is mounted by only a single operation of dropping the carrier cap onto the carrier body for realizing the automation.

Sixth, the carrier cap and the carrier body are made of the same material so as to prevent any formation of broken pieces due to friction between respective engagement portions of the carrier cap and the cap hooks of the carrier body.

Seventh, the elastomer relaxes the difference in level of the bumps when the bare chip is mounted onto the carrier body, so as to keep a distance between the bare chip and the contact sheet for preventing any contact of circuits on the contact sheet and the bare chip.

Eighth, the elastomer relaxes variation in level of the bumps on the contact sheet when the bare chip is mounted onto the carrier body, so as to allow a stable contact between the bare chip and the contact sheet. The elastomer is made of a material which has a high elasticity and prevents a deformation of the contact sheet under high temperature condition, whereby the durability is improved.

Whereas modifications of the present invention will be apparent to a person having ordinary skill in the art, to which the invention pertains, it is to be understood that embodiments as shown and described by way of illustrations are by no means intended to be considered in a limiting sense. Accordingly, it is to be intended to cover by claims all modifications which fall within the spirit and scope of the present invention.

What is claimed is:

1. A bare chip carrier comprising:
   a carrier body having a base portion on which a bare chip may be mounted and also having at least one cap holder; and
   a carrier cap separate from said carrier body, said carrier cap having a pressing member urged by a spring for pressing said bare chip toward said base portion of said body, said pressing member being connected to said spring through a ball bearing,
      wherein said at least one cap holder has at least a holder engagement portion adapted to be engaged with a cap engagement portion of said carrier cap, so that said carrier cap separated from said carrier body is held by said at least one cap holder.

2. The bare chip carrier as claimed in claim 1, comprising at least two of said cap holders, each of said cap holders being hinged to said carrier body and each of said cap having a flexibility for allowing said carrier cap to be snapped into a frame of said carrier body and held with engagements between said holder engagement portion and said cap engagement portion.

3. The bare chip carrier as claimed in claim 1, wherein said pressing member has at least one protruded contact portion which is to be made into contact with part of said bare chip so as to apply said pressing force through said at least one protruded contact portion to part of said bare chip for preventing an entire surface of said bare chip is pressed by said pressing member.

4. The bare chip carrier as claimed in claim 1, wherein said carrier body further has a contact sheet having bumps provided at corresponding positions to pads of said bare chip.

5. The bare chip carrier as claimed in claim 1, wherein said base portion has a recessed part receiving an elastomer.

6. A bare chip carrier comprising:
   a carrier body having a base portion on which a bare chip is mounted and also having at least one cap holder; and
   a carrier cap separate from the carrier body, and said carrier cap having a pressing member for pressing said bare chip toward said base portion of said body,
      wherein said carrier cap further has a spring member for applying a spring force to said pressing member toward said bare chip, and said carrier cap further comprising a ball bearing disposed between said spring member and said pressing member.

7. The bare chip carrier as claimed in claim 6, wherein said at least one cap holder has at least a holder engagement portion which is to be engaged with a cap engagement portion of said carrier cap, so that said carrier cap is held by said at least one cap holder.

8. The bare chip carrier as claimed in claim 7, comprising at least two of said cap holders, each of said cap holders being hinged to said carrier body and each of said cap having a flexibility for allowing said carrier cap to be snapped into a frame of said carrier body and held with engagements between said holder engagement portion and said cap engagement portion.

9. The bare chip carrier as claimed in claim 6, wherein said pressing member has at least one protruded contact portion which is to be made into contact with part of said bare chip so as to apply said pressing force through said at least one protruded contact portion to part of said bare chip for preventing an entire surface of said bare chip is pressed by said pressing member.

10. The bare chip carrier as claimed in claim 6, wherein said carrier body further has a contact sheet having bumps provided at corresponding positions to pads of said bare chip.

11. The bare chip carrier as claimed in claim 6, wherein said base portion has a recessed part receiving an elastomer.

12. A bare chip carrier comprising:
   a carrier body having a base portion on which a bare chip is mounted and also having at least one cap holder; and
   a carrier cap separate from said carrier body having a pressing member urged by a spring for pressing said bare chip toward said base portion of said body, said pressing member being connected to said spring through a ball bearing,
      wherein said pressing member has at least one protruded contact portion arranged so as to be brought into contact with part of said bare chip so as to apply said pressing force through said at least one protruded contact portion to part of said bare chip to prevent an entire surface of said bare chip from being pressed by said pressing member.

13. The bare chip carrier as claimed in claim 12, comprising at least two of said cap holders, each of said cap holders being hinged to said carrier body and each of said cap having a flexibility for allowing said carrier cap to be snapped into a frame of said carrier body and held with engagements between said holder engagement portion and said cap engagement portion.

14. The bare chip carrier as claimed in claim 12, wherein said pressing member has at least one protruded contact portion which is to be made into contact with part of said bare chip so as to apply said pressing force through said at least one protruded contact portion to part of said bare chip for preventing an entire surface of said bare chip is pressed by said pressing member.

15. The bare chip carrier as claimed in claim 12, wherein said carrier body further has a contact sheet having bumps provided at corresponding positions to pads of said bare chip.

16. The bare chip carrier as claimed in claim 12, wherein said base portion has a recessed part receiving an elastomer.

17. A bare chip carrier comprising:
   a carrier body having a base portion and also having at least one cap holder which has at least a holder engagement portion;
   a carrier cap separate from said carrier body, said carrier cap having a carrier cap engagement portion adapted to be engaged with said holder engagement portion for holding said carrier cap to said carrier body, and said carrier cap having a pressing member for pressing said bare chip toward said base portion of said body upon holding said carrier cap to said carrier body; and
   a contact sheet disposed on said base portion, so that a bare chip may be mounted over said contact sheet, and said contact sheet having bumps provided at corresponding positions to pads of said bare chip.

18. The bare chip carrier as claimed in claim 17, wherein said carrier cap further has a spring member for applying a spring force to said pressing member toward said bare chip, and said carrier cap further has a ball bearing disposed between said spring member and said pressing member.

19. The bare chip carrier as claimed in claim 17, comprising at least two of said cap holders, each of said cap holders being hinged to said carrier body and each of said cap having a flexibility for allowing said carrier cap to be snapped into a frame of said carrier body and held with engagements between said holder engagement portion and said cap engagement portion.

20. The bare chip carrier as claimed in claim 17, wherein said pressing member has at least one protruded contact portion which is to be made into contact with part of said bare chip so as to apply said pressing force through said at least one protruded contact portion to part of said bare chip for preventing an entire surface of said bare chip is pressed by said pressing member.

21. The bare chip carrier as claimed in claim 17, wherein said base portion has a recessed part receiving an elastomer.

22. A bare chip carrier comprising:
a carrier body having a base portion and also having at least one cap holder which has at least a holder engagement portion; and
a carrier cap separate from said carrier body, said carrier cap having a carrier cap engagement portion adapted to be engaged with said holder engagement portion for holding said carrier cap to said carrier body; and
a pressing member for pressing said bare chip toward said base portion of said body upon holding said carrier cap to said carrier body,
wherein said base portion has a recessed part receiving an elastomer.

23. The bare chip carrier as claimed in claim 22, further comprising a contact sheet disposed on said base portion, so that a bare chip may be mounted over said contact sheet, and said contact sheet having bumps provided at corresponding positions to pads of said bare chip.

24. The bare chip carrier as claimed in claim 22, wherein said carrier cap further has a spring member for applying a spring force to said pressing member toward said bare chip, and said carrier cap further has a ball bearing disposed between said spring member and said pressing member.

25. The bare chip carrier as claimed in claim 22, comprising at least two of said cap holders, each of said cap holders being hinged to said carrier body and each of said cap having a flexibility for allowing said carrier cap to be snapped into a frame of said carrier body and held with engagements between said holder engagement portion and said cap engagement portion.

26. The bare chip carrier as claimed in claim 22, wherein said pressing member has at least one protruded contact portion which is to be made into contact with part of said bare chip so as to apply said pressing force through said at least one protruded contact portion to part of said bare chip for preventing an entire surface of said bare chip is pressed by said pressing member.

27. A bare chip carrier comprising:
a carrier body having a base portion and also having at least one cap holder which has at least a holder engagement portion;
a carrier cap separate from said carrier body, said carrier cap having a carrier cap engagement portion adapted to be engaged with said holder engagement portion for holding said carrier cap to said carrier body, and said carrier cap having a pressing member for pressing said bare chip toward said base portion of said body; and
a first elastomer provided between said carrier cap and said pressing member for providing an elastic force to said pressing member upon holding said carrier cap to said carrier body.

28. The bare chip carrier as claimed in claim 27, wherein said base portion has a recessed part receiving a second elastomer.

29. The bare chip carrier as claimed in claim 28, wherein said first and second elastomers are made of the same material.

30. The bare chip carrier as claimed in claim 27, wherein said first elastomer comprises a rectangle-shaped silicone resin material.

31. The bare chip carrier as claimed in claim 27, wherein said first elastomer comprises a rectangle-shaped silicone resin material having air-containing cells.

32. The bare chip carrier as claimed in claim 27, comprising at least two of said cap holders, each of said cap holders being hinged to said carrier body and each of said cap having a flexibility for allowing said carrier cap to be snapped into a frame of said carrier body and held with engagements between said holder engagement portion and said cap engagement portion.

33. The bare chip carrier as claimed in claim 27, wherein said pressing member has at least one protruded contact portion which is to be made into contact with part of said bare chip so as to apply said pressing force through said at least one protruded contact portion to part of said bare chip for preventing an entire surface of said bare chip is pressed by said pressing member.

34. The bare chip carrier as claimed in claim 27, wherein said carrier body further has a contact sheet having bumps provided at corresponding positions to pads of said bare chip.

35. A bare chip carrier comprising:
a carrier body having a base portion and also having at least one cap holder which has at least a holder engagement portion;
a carrier cap separate from said carrier body, said carrier cap having a carrier cap engagement portion adapted to be engaged with said holder engagement portion for holding said carrier cap to said carrier body, and said carrier cap having a means for pressing said bare chip toward said base portion of said body upon holding said carrier cap to said carrier body; and
a contact sheet disposed on said base portion, so that a bare chip may be mounted over said contact sheet, and said contact sheet having bumps provided at corresponding positions to pads of said bare chip.

36. The bare chip carrier as claimed in claim 35, wherein said means for pressing said bare chip further comprises:
a pressing member adjacent to said bare chip;
a spring member for applying a spring force to a pressing member toward said bare chip; and
a ball bearing disposed between said spring member and said pressing member.

37. The bare chip carrier as claimed in claim 35, wherein said means for pressing said bare chip further comprises :
a pressing member adjacent to said bare chip ; and
an elastomer provided between said carrier cap and said pressing member for providing an elastic force to said pressing member upon holding said carrier cap to said carrier body.

38. The bare chip carrier as claimed in claim 35, comprising at least two of said cap holders, each of said cap holders being hinged to said carrier body and each of said cap having a flexibility for allowing said carrier cap to be snapped into a frame of said carrier body and held with engagements between said holder engagement portion and said cap engagement portion.

39. The bare chip carrier as claimed in claim 35, wherein said pressing member has at least one protruded contact portion which is to be made into contact with part of said bare chip so as to apply said pressing force through said at least one protruded contact portion to part of said bare chip for preventing an entire surface of said bare chip is pressed by said pressing member.

40. The bare chip carrier as claimed in claim 35, wherein said base portion has a recessed part receiving an elastomer.

41. A bare chip carrier comprising:
   a carrier body having a base portion and also having at least one cap holder which has at least a holder engagement portion; and
   a carrier cap separate from said carrier body, said carrier cap having a carrier cap engagement portion adapted to be engaged with said holder engagement portion for holding said carrier cap to said carrier body, and said carrier cap having a means for pressing said bare chip toward said base portion of said body upon holding said carrier cap to said carrier body,
      wherein said base portion has a recessed part receiving an elastomer.

42. The bare chip carrier as claimed in claim 41, further comprising a contact sheet disposed on said base portion, so that said bare chip may be mounted over said contact sheet, and said contact sheet having bumps provided at corresponding positions to pads of said bare chip.

43. The bare chip carrier as claimed in claim 41, wherein said means for pressing said bare chip further comprises:
   a pressing member adjacent to said bare chip;
   a spring member for applying a spring force to a pressing member toward said bare chip; and
   a ball bearing disposed between said spring member and said pressing member.

44. The bare chip carrier as claimed in claim 41, wherein said means for pressing said bare chip further comprises :
   a pressing member adjacent to said bare chip ; and
   an elastomer provided between said carrier cap and said pressing member for providing an elastic force to said pressing member upon holding said carrier cap to said carrier body.

45. The bare chip carrier as claimed in claim 41, comprising at least two of said cap holders, each of said cap holders being hinged to said carrier body and each of said cap having a flexibility for allowing said carrier cap to be snapped into a frame of said carrier body and held with engagements between said holder engagement portion and said cap engagement portion.

46. The bare chip carrier as claimed in claim 41, wherein said pressing member has at least one protruded contact portion which is to be made into contact with part of said bare chip so as to apply said pressing force through said at least one protruded contact portion to part of said bare chip for preventing an entire surface of said bare chip is pressed by said pressing member.

* * * * *